(12) United States Patent
Chen et al.

(10) Patent No.: US 9,967,774 B2
(45) Date of Patent: May 8, 2018

(54) COMPRESSION METHOD FEATURING DYNAMIC CODING FOR WIRELESS COMMUNICATION IN WIRELESS NETWORKS

(71) Applicant: National Chiao Tung University, Hsinchu (TW)

(72) Inventors: Jyh-Cheng Chen, Hsinchu (TW); Ruei-Hau Hsu, Kaohsiung (TW); Wei-Lun Shih, Douliu (TW); Jui-Chih Chin, New Taipei (TW); Chun Chien, Taipei (TW)

(73) Assignee: National Chiao Tung University, Hsinchu (TW)

( * ) Notice: Subject to any disclaimer, the term of this patent is extended or adjusted under 35 U.S.C. 154(b) by 263 days.

(21) Appl. No.: 14/932,636

(22) Filed: Nov. 4, 2015

(65) Prior Publication Data

US 2016/0135085 A1    May 12, 2016

(30) Foreign Application Priority Data

Nov. 11, 2014   (TW) .............................. 103139020 A

(51) Int. Cl.
| | |
|---|---|
| *H03M 7/40* | (2006.01) |
| *H04W 28/02* | (2009.01) |
| *H04W 28/06* | (2009.01) |
| *H04L 12/801* | (2013.01) |

(52) U.S. Cl.
CPC ........... *H04W 28/065* (2013.01); *H03M 7/40* (2013.01); *H04L 47/12* (2013.01)

(58) Field of Classification Search
None
See application file for complete search history.

(56) References Cited

U.S. PATENT DOCUMENTS

| | | | |
|---|---|---|---|
| 7,719,443 B1 * | 5/2010 | Natanzon ............ | G06F 11/1471 341/50 |
| 2010/0329256 A1 | 12/2010 | Akella et al. | |
| 2011/0282932 A1 | 11/2011 | Ramjee et al. | |

OTHER PUBLICATIONS

A. Anand et al., "Redundancy in Network Traffic: Findings and Implications," SIGMETRICS, Jun. 15-19, 2009, 12 pp.
(Continued)

*Primary Examiner* — Noel E Beharry
*Assistant Examiner* — Nicole King
(74) *Attorney, Agent, or Firm* — Rosenberg, Klein & Lee

(57) ABSTRACT

A compression method featuring dynamic coding for wireless communication in wireless network is used to transmit a packet to clients. An access point (AP) divides a packet into several chunks all having a fixed length, sorts repetition frequencies of all the chunks, and encodes the repeated chunks with Huffman codes. Before transmitting the packet, AP divides the packet into chunks and determines whether there are chunks having been encoded, and transmits the encoded packet and the codes thereof to a specified client and other clients within coverage of transmission. After receiving the encoded packets, the client decodes the encoded packets to recover the original ones. The other clients also store the repeated chunks and the codes thereof. The information of the Huffman codes of the repeated chunks needn't be transmitted every time for different clients since other clients may overhear the Huffman codes not intended to send to them.

10 Claims, 7 Drawing Sheets

(56) References Cited

OTHER PUBLICATIONS

A. Anand et al., "Packet Caches on Routers: The Implications of Universal Redundant Traffic Elimination," *SIGCOMM*, Aug. 17-22, 2008, 12 pp.
B. Aggarwal et al., "EndRE: An End-System Redundancy Elimination Service for Enterprises," *SIGCOMM*, 2010, 14 pp.
S. Sanadhya et al., "Asymmetric Caching: Improved Network Deduplication for Mobile Devices," *MobiCom*, Aug. 22-26, 2012, pp. 161-172.
N. T. Spring et al., "A Protocol-Independent Technique for Eliminating Redundant Network Traffic," *SIGCOMM*, 2000, pp. 87-95.
S.H. Shen et al. "Refactor-ing Content Overhearing to Improve Wireless Performance," *MobiCom*, Sep. 19-23, 2011, 12 pp.

\* cited by examiner

COMPRESSION METHOD FEATURING DYNAMIC CODING FOR WIRELESS COMMUNICATION IN WIRELESS NETWORKS

This application claims priority for Taiwan patent application no. 103139020 filed on Nov. 11, 2014, the content of which is incorporated by reference in its entirely.

BACKGROUND OF THE INVENTION

Field of the Invention

The present invention relates to a compression method for wireless communication in wireless networks, particularly to a compression method featuring dynamic coding for wireless communication in wireless networks.

Description of the Related Art

As the radio waves can penetrate through most barriers, the wireless communication technology is free of physical cables and exempt from maintaining the cable system. Therefore, the network industry has been persistently devoted to developing wireless communication technology.

In the wireless network technology, data is divided into many segments and then sent out in a wireless broadcasting way in different frequencies, whereby different nodes can link mutually and exchange information. The wireless access point, also called the wireless transceiving box or the wireless network base station, is an intermediate device enabling interconnection among wireless network devices or interconnection between wireless network devices and wired network devices.

In a wireless network, if a recipient detects an error in a packet sent by an access point, the recipient would demand the access point to transmit the packet once again. However, retransmission of packets would seriously decrease transmission speed in the wireless network.

Besides, packet collision also greatly affects the efficiency of a wireless network. While the users directly communicate in a wireless network group, packet collision would cause the bandwidth to shrink obviously. If the bandwidth should reduce to lower than the minimum bandwidth required by the access points, the network communication would interrupt or break down, which would damage signals between nodes seriously.

The present invention intends to solve the problem that the efficiency of wireless networks is reduced by packet retransmission and packet collision and thus proposes a compression method featuring dynamic coding for wireless communication in wireless networks.

SUMMARY OF THE INVENTION

The primary objective of the present invention is to provide a compression method featuring dynamic coding for wireless communication in wireless networks, which determines whether a chunk has been encoded into a Huffman code and a hash function code according to the information of the repetition frequency of the chunk and transmits the chunk and the Huffman code thereof to all recipients of wireless networks, whereby to increase the repetition frequency of chunks, avoid retransmission and collision of packets, shorten the code length, and increase the overall compression rate. Further, the present invention uses a simple packet-division method, which is able to reduce computation load and easy to realize in the current network environment.

Another objective of the present invention is to provide a compression method featuring dynamic coding for wireless communication in wireless networks, which uses the Huffman coding theory to undertake statistics of the data transmitted before to predict the probability of transmitting the same data in future and optimize the code length, and which uses a Huffman coding method that uses the shortest codes to replace the most frequently transmitted data obviously decrease the computation load of the recipients, whereby the recipients needn't empty the register for a long time and the repetition frequency increases.

In order to achieve the abovementioned objectives, the present invention proposes a compression method featuring dynamic coding for wireless communication in wireless networks, which comprises steps: updating the information of the repetition frequencies of chunks and undertaking statistics of the repetition frequencies; determining whether the Huffman code of a chunk has been established and whether the chunk has a hash function code; determining whether the Huffman code of the chunk was transmitted before; then transmitting the hash function code or the chunks and the Huffman codes of the chunks.

Below, embodiments are described in detail in cooperation with attached drawings to make easily understood the objectives, technical contents, characteristics and accomplishments of the present invention.

DETAILED DESCRIPTION OF THE INVENTION

The present invention mainly pertains to a compression method featuring dynamic coding for wireless communication in wireless networks. However, an embodiment of a related device will be used to fully demonstrate the technical thoughts of the present invention so as to enable the persons skilled in the art to understand, make, and use the present invention.

Figure 1:
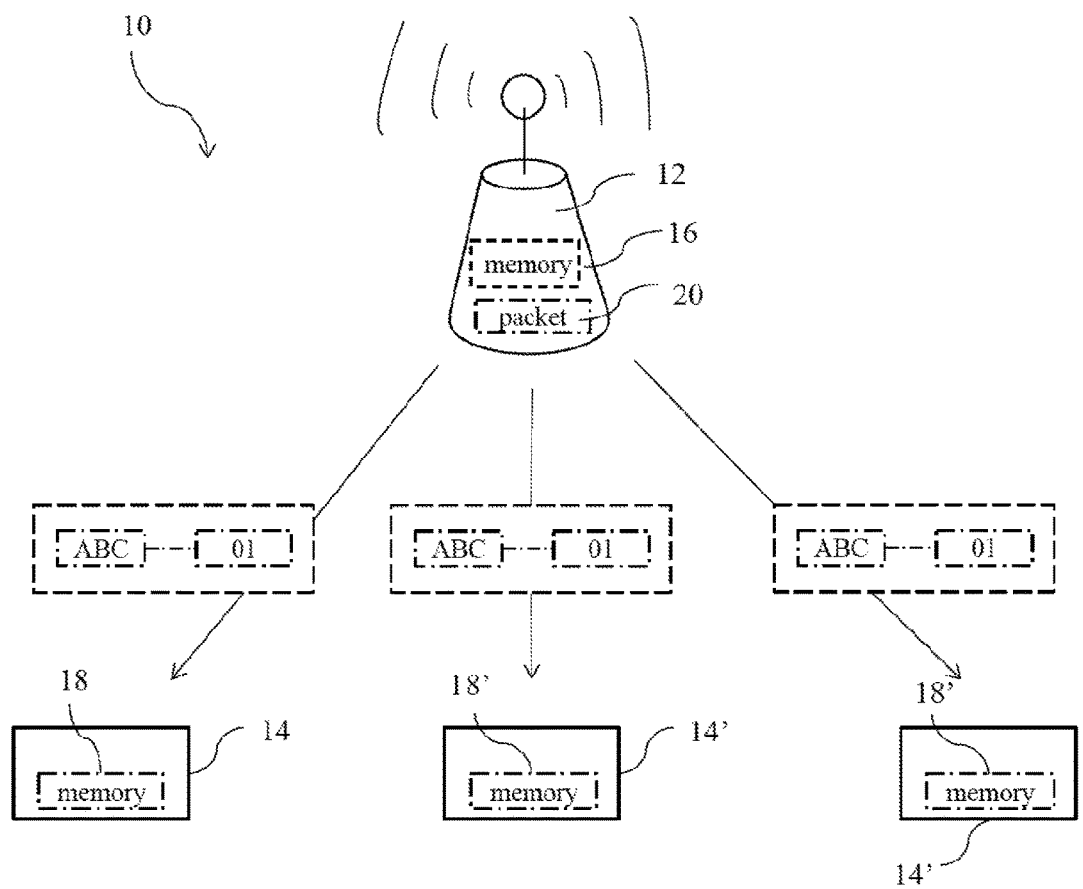
FIG. 1 schematically shows a wireless network transmission device according to one embodiment of the present invention.
Figure 2:
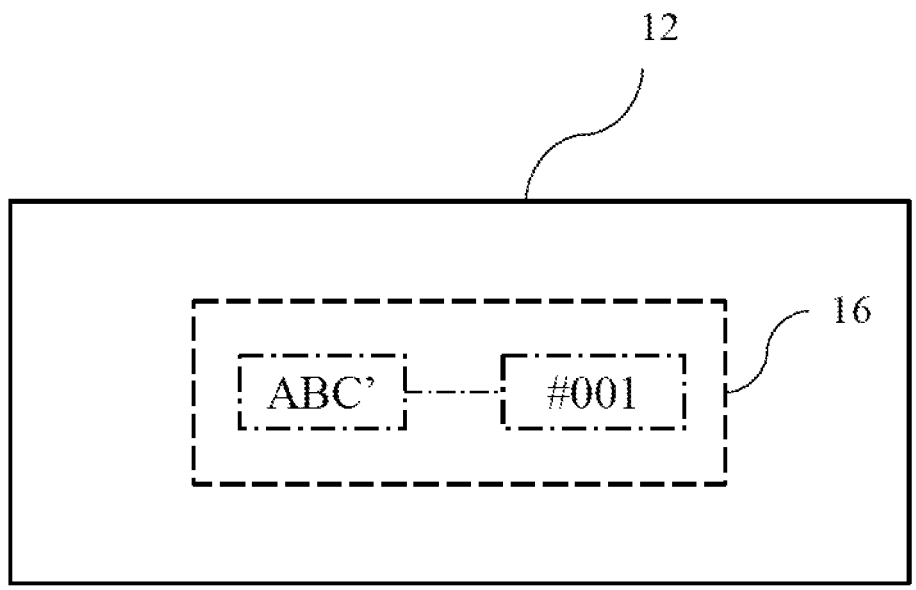
FIG. 2 schematically shows an access point according to one embodiment of the present invention.

Refer to FIG. 1 and FIG. 2. FIG. 1 schematically shows a wireless network transmission device according to one embodiment of the present invention. FIG. 2 schematically shows an access point according to one embodiment of the present invention. The wireless network transmission-compression device 10 of the present invention comprises an access point 12 and clients 14 and 14'. The access point 12 is also called the wireless transceiving box or the wireless network base station. The clients 14 and 14' are mobile devices, such as portable gamers, mobile phones, smartphones, tablet computers, and notebook computers. The access point 12 has a memory 16, and the clients 14 and 14' also respectively have memories 18 and 18'.

The wireless network transmission-compression device 10 receives a packet 20 from the memory 16 of the access point 12, divides the packet 20 into a plurality of chunks ABC, respectively establishes information of repetition frequencies and codes for the chunks ABC, and transmits the chunks ABC and the codes thereof to the clients 14 and 14'. Each of the clients 14 and 14' receives the chunks ABC and the codes thereof and stores them in the memory 18 or 18'. In order to fully and clearly disclose the present invention to enable the persons skilled in the art to understand, make, and use the present invention, the transmitted data is simplified to be ABC, and the Huffman code representing each chunk is simplified to be 01, in FIG. 1. However, other codes can also be used to represent the chunks in the present invention. As shown in FIG. 2, the memory 16 of the access point 12 also records a new chunk ABC' and the hash function (HF) code. Thereof in FIG. 2, #001 represents the hash function code. The Huffman code 01 and the hash function code #001 are stored in the memory 16 or the memories 18 and 18'.

Figure 3:
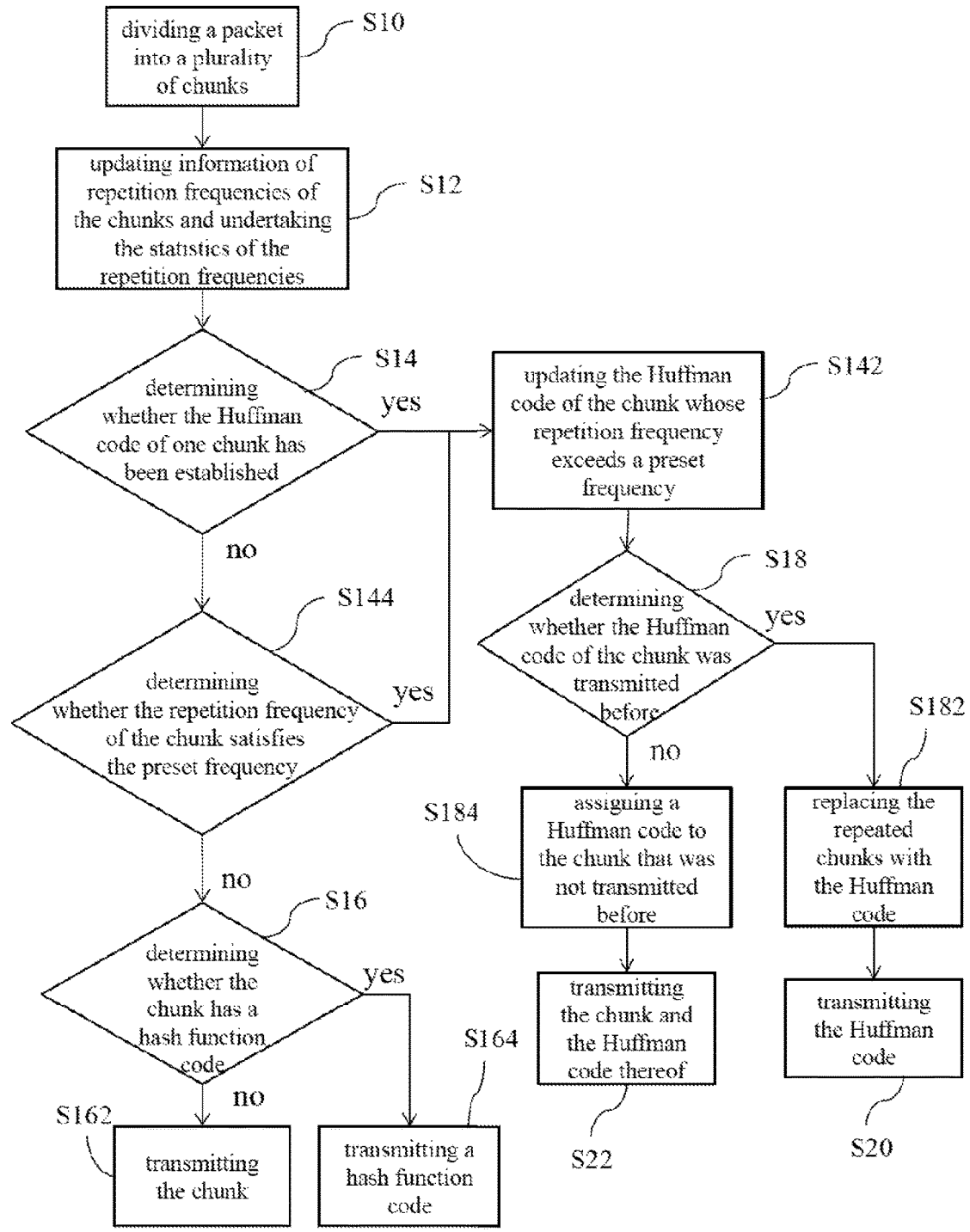
FIG. 3 shows a flowchart of a compression method featuring dynamic coding for wireless communication in wireless networks according to one embodiment of the present invention.

Refer to FIG. 3, and refer to FIG. 1 again. FIG. 3 shows a flowchart of a compression method featuring dynamic coding for wireless communication in wireless networks according to one embodiment of the present invention. The method of the present invention comprises Steps S10-S22. In Step S10, the method of the present invention divides a packet 20 into a plurality of chunks ABC which are to be used to transmit the chunks ABC to the clients 14 and 14', and establishes information of repetition frequencies for the chunks ABC. In Step S12, the method of the present invention updates the information of the repetition frequencies of the chunks ABC and undertakes the statistics of the repetition frequencies. In Step S14, the method of the present invention determines whether the Huffman code 01 of one chunk ABC has been established. If the Huffman code 01 of the chunk ABC has been established, the process proceeds to Step S142. In Step S142, the method of the present invention updates the Huffman code 01 of the chunk ABC whose repetition frequency exceeds a preset frequency, and then the process proceeds to Step S18. If the Huffman code 01 of the chunk ABC has not yet been established, the process proceeds to Step S144. Step S142 also can save the repetition frequency that exceeds a preset frequency, then after a time interval of a cycle, update the statistics information of repetition frequency of each chunk. If frequently update the statistics information of repetition frequency of each chunk, when the repetition frequency exceeds the preset frequency, it might increase the cost. And the Huffman code of chunk might have been updated without being used. In Step S144, the method of the present invention determines whether the repetition frequency of the chunk ABC satisfies the preset frequency, If yes, the process proceeds to Step S142, If no, the process proceeds to Step S16.

In Step S16, the method of the present invention determines whether the chunk ABC has a hash function code #001. If the chunk ABC does not have a hash function code #001, the process proceeds to Step S162. In Step S162, the method of the present invention encoding each chunk ABC with a hash function code #001, stores the hash function code #001 in the memory 16, and transmits a chunk ABC. If the chunk ABC has a hash function code #001, the process proceeds to Step S164. In Step S164, the method of the present invention transmitting a hash function code #001.

Figure 4:
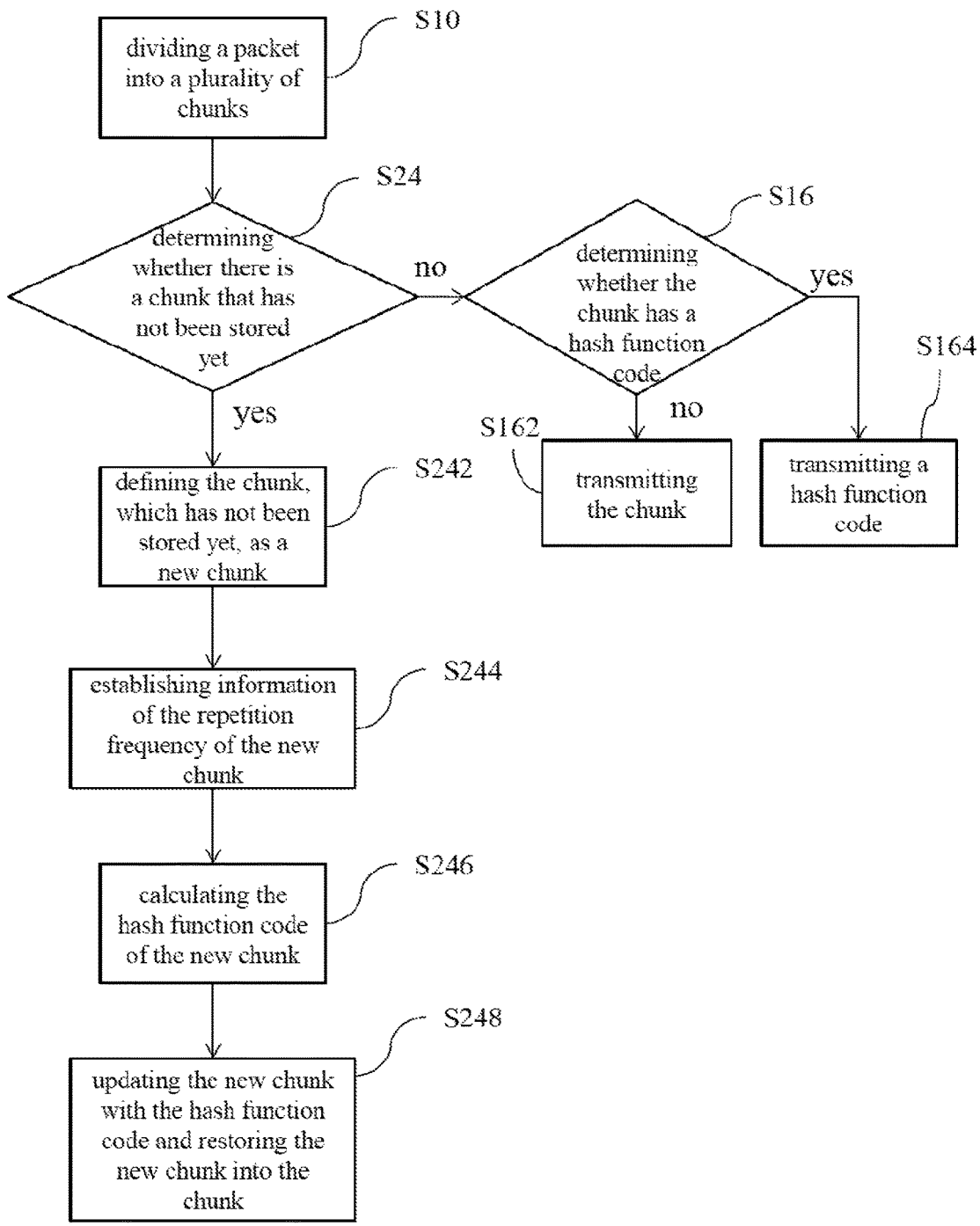
FIG. 4 shows a flowchart of a compression method featuring dynamic coding having an additional process to check unrecorded chunks according to one embodiment of the present invention.

As mentioned above, in Step S142, the method of the present invention updates the Huffman code 01 of the chunk ABC whose repetition frequency exceeds a preset frequency, and then the process proceeds to Step S18. In Step S18, the method of the present invention determines whether the Huffman code 01 of the chunk ABC was transmitted before. If the Huffman code 01 of the chunk ABC was transmitted before, the process proceeds to Step S182. In Step S182, the method of the present invention replaces the repeated chunk ABC with the Huffman code 01, and then the process proceeds to Step S20. In Step S20, the method of the present invention transmits the Huffman code 01. If the Huffman code 01 of the chunk ABC was not transmitted before, the process proceeds to Step S184. In Step S184, the method of the present invention assigns a Huffman code 01 to the chunk ABC that was not transmitted before, and then the process proceeds to Step S22. In Step S22, the method of the present invention transmits the chunk ABC and the Huffman code 01 thereof to the clients 14 and 14' and stores the chunk ABC and the Huffman code 01 thereof in the memories 18 and 18'. In the present invention, the hash function code #001 used to encode the chunk ABC is a sequence of random numbers so as to compress the chunk ABC into a shorter sequence of bits. In the present invention, the update of a Huffman code is dependent on the time interval of a cycle with respect to the repetition frequency which is referred to the times of the appearance of the chunk ABC. The preset frequency is used as a threshold. Suppose that the preset frequency is 5. If the repetition frequency of a chunk ABC is smaller than 5, the method of the present invention does not assign a Huffman code to the chunk ABC. Refer to FIG. 4, and refer to FIG. 2 again. The method of the present invention further comprises Step S24 undertaken before Step S12. In Step S24, the method of the present invention determines whether the memory 16 has a chunk ABC that has not been stored yet. If the memory 16 has a chuck ABC that has not been stored yet, the process proceeds to Step S242. In Step S242, the method of the present invention defines the chunk ABC, which has not been stored yet, as a new chunk ABC', and then the process proceeds to Step S244. In Step S244, the method of the present invention establishes the information of the repetition frequency of the new chunk ABC'. Then, the process proceeds to Step S246. In Step S246, the method of the present invention calculates the hash function code #001 of the new chunk ABC'. Then, the process proceeds to Step S248. In Step S248, the method of the present invention updates the new chunk ABC' with the hash function code #001 and restores the new chunk ABC' into the chunk ABC. If the memory 16 does not have a chuck ABC that has not been stored yet, the process proceeds to Step S16.

Figure 5:
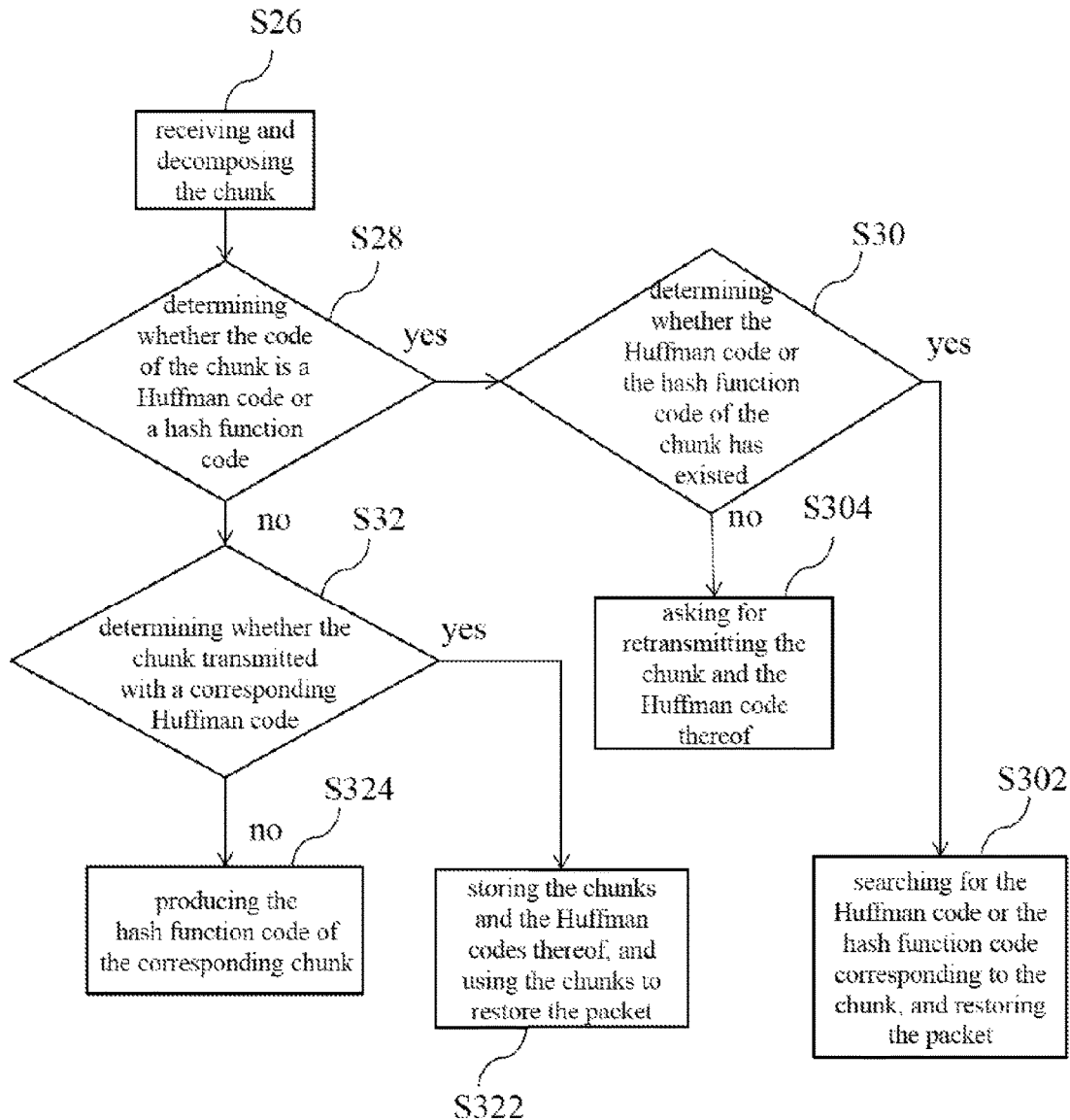
FIG. 5 shows a flowchart of a compression method featuring dynamic coding, which is applied to clients, according to one embodiment of the present invention.

Refer to FIG. 5, and refer to FIG. 1 again. FIG. 5 shows a flowchart of a compression method featuring dynamic coding for wireless communication in wireless networks, which is applied to clients, according to one embodiment of the present invention. The process of the method of the present invention applied to the clients 14 and 14' succeeds to Step S20 or Step S22 and comprises Steps S26-S32. In Step S26, the method of the present invention receives and decomposes the chunk ABC. In Step S28, the method of the present invention determines whether the code corresponding to the chunk ABC is a Huffman code 01 or a hash function code #001. If the code corresponding to the chunk ABC is a Huffman code 01 or a hash function code #001, the process proceeds to Step S30. If the code corresponding to the chunk ABC is neither a Huffman code 01 nor a hash function code #001, the process proceeds to Step S32. In Step S30, the method of the present invention determines whether the Huffman code 01 or the hash function code #001 of the chunk ABC has existed. If the Huffman code 01 or the hash function code #001 of the chunk ABC has existed, the process proceeds to Step S302. In Step S302, the method of the present invention searches for the Huffman code 01 or the hash function code #001 corresponding to the chunk ABC, and restores the packet 20. If the Huffman code 01 or the hash function code #001 of the chunk ABC does not exist, the process proceeds to Step S304. In Step S304, the method of the present invention asks for retransmitting the chunk ABC and the Huffman code 01 thereof. In Step S32, the method of the present invention determining whether the chunk ABC transmitted with a corresponding Huffman code 01. If the chunk ABC transmitted with a corresponding Huffman code 01, the process proceeds to Step S322. In Step S322, the method of the present invention stores the chunks ABC and the Huffman codes thereof, and uses the chunks ABC to restore the packet 20. If the chunk ABC not transmitted with a corresponding Huffman code 01, the process proceeds to Step S324. In Step S324, the method of the present invention producing the hash function code #001 of the corresponding chunk.

In summary, the present invention proposes a compression method featuring dynamic coding for wireless communication in wireless networks, which includes technical thoughts: dividing the packet, which is to be sent to clients, into a plurality of chunks ABC all having a given length; undertaking statistics of the repetition frequency of each chunk ABC; establishing Huffman codes 01 for the sorted repetition frequencies, wherein the Huffman code 01 is dependent on the time interval of the cycle with respect to the repetition frequency; supposing that 01, 001, 0001 and 00001 respectively express the Huffman codes whose lengths increase in sequence; while a chunk ABC appears very frequently, using a shorter Huffman code 01; while a chunk ABC appears less frequently, using a longer Huffman code 00001.

The present invention acquires higher transmission speed in a limited bandwidth in wireless transmission via increasing computation capacity and storage space in the access point 12 and the clients 14 and 14'. The present invention encodes chunks with the Huffman coding method and the hash-function coding method. Therefore, the present invention is applicable to mobile device networks and other wireless networks.

The present invention records the behavior of packet transmission, encodes the packets according to the Huffman coding theory, and shares the Huffman codes in a wireless way. As the repeated packet is encoded with only few bits, the transmission speed and the bandwidth efficiency is significantly increased. As the wireless network has the characteristic of broadcasting, the access point 12 can share the codes of packets in a limited-resource transmission environment to enable the access points and mobile devices to achieve higher transmission throughput in a limited bandwidth.

The present invention records the contents of the packets 20 transmitted before and the repetition frequencies of the contents, and then encodes the contents of the packets 20. The content of the packet 20 having the highest repetition frequency is encoded with the shortest code. Thus, the total contents of the packet 20 have approximately optimized coding. The present invention modifies the coding tactics according to the history of the repetition frequencies of the contents of packets 20. Therefore, the coding can adapt to the latest transmission condition of the wireless network. In the present invention, the computation for coding is mainly executed in the access point 12. Therefore, the present invention is feasible for the clients 14 and 14' having limited computation resources, such as mobile phones and tablet computers.

The discussion made above and the related drawings have schematically demonstrated the device configuration and technical thoughts of the compression method featuring dynamic coding for wireless communication in wireless networks of the present invention. Below, the embodiments and the related statistic method of the present invention will be described in further detail in cooperation with Table.1 and the related drawings.

TABLE 1

| Transmission Order | Content | Recipient | Occurrence | Coding Code | Coding Method | Appearance for the First Time? |
|---|---|---|---|---|---|---|
| 1 | ABC | 14 | 1 | #101 | HF | yes (H(ABC) = #101) |
| 23 | DFE | 14' | 1 | #001 | HF | yes (H(DFE) = #001) |
| 56 | DFE | 14 | 3 | #001 | generated | no (generated) |
| 80 | DFE | 14 | 7 | 01 | Huffman | no (01) |
| 100 | ABC | 14' | 5 | 00 | Huffman | no (00) |

Figure 6:
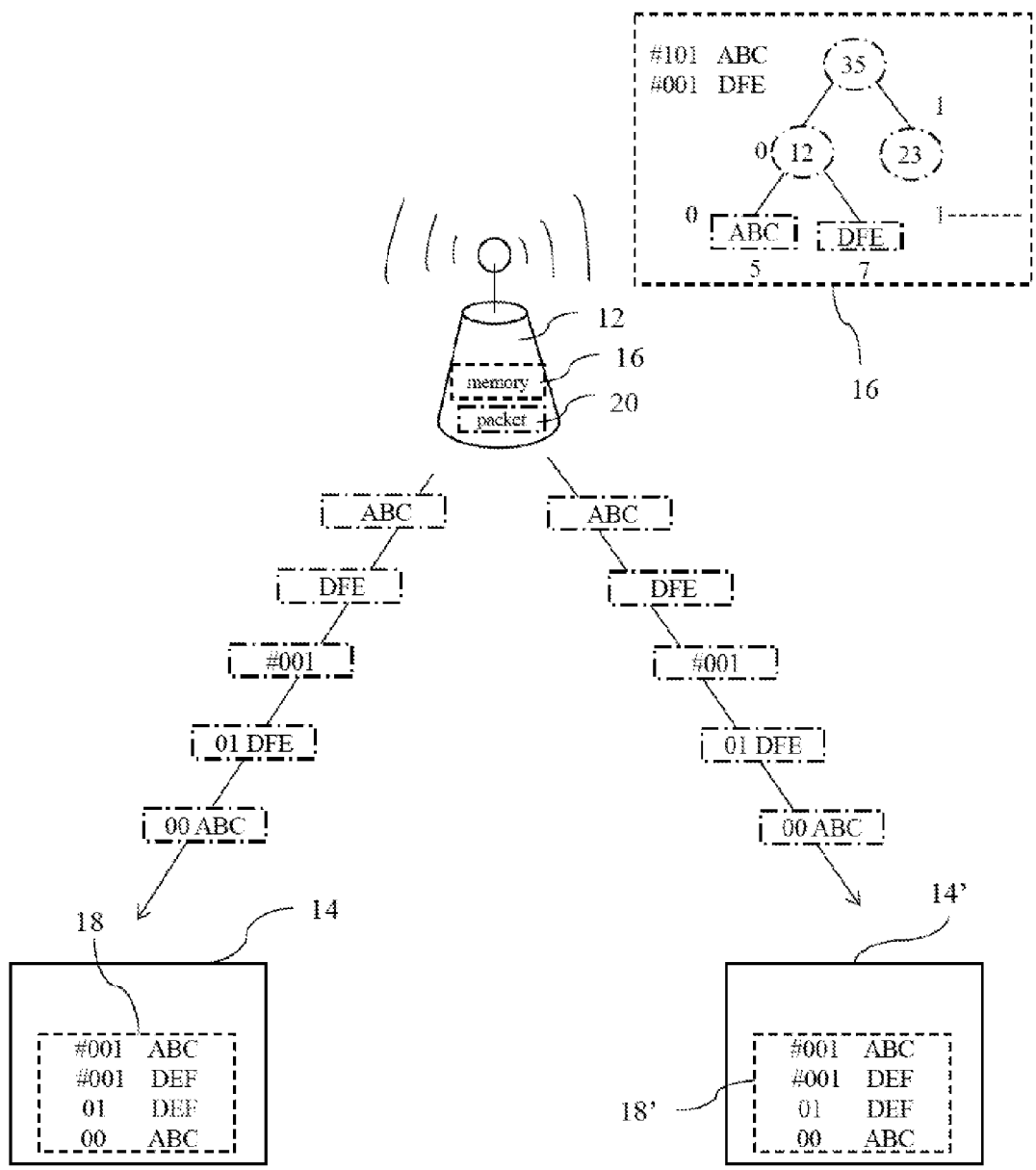
FIG. 6 schematically shows the packet transmission in a wireless network according to one embodiment of the present invention.

Refer to FIG. 6 and Table.1. FIG. 6 schematically shows the packet transmission in a wireless network according to one embodiment of the present invention. Suppose that the contents of the packet 20 are respectively "ABC" and "DEF." The access point 12 transmits the contents "ABC" and "DEF" to the clients 14 and 14', and the contents are stored in the memories 18 and 18'. The method of the present invention establishes the Huffman code of the chunk ABC according to the repetition frequency thereof. The higher the repetition frequency of a chunk ABC or DEF, the shorter the code the Huffman coding method uses to encode the chunk ABC or DEF, such as 00 and 01. The lower the repetition frequency of a chunk ABC or DEF, the longer the code the Huffman coding method uses to encode the chunk ABC or DEF.

Figure 7:
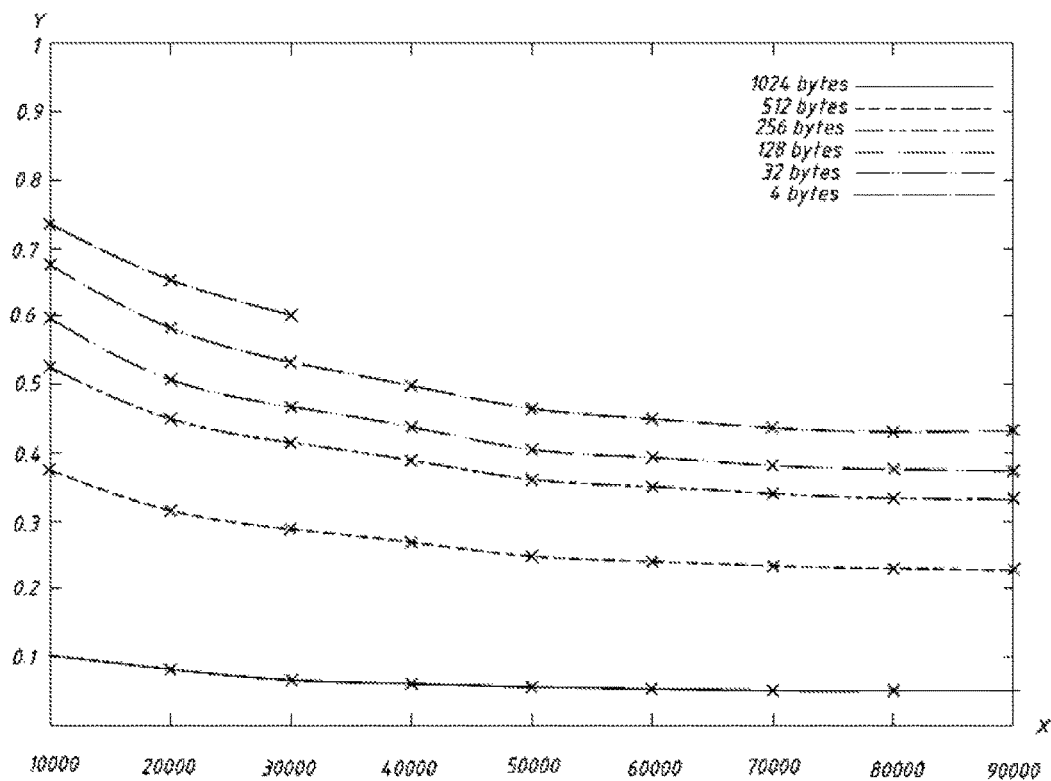
FIG. 7 shows the repetition frequencies of the packets according to one embodiment of the present invention.

Refer to FIG. 7, and refer to FIG. 1 again. FIG. 7 shows the repetition frequencies of the packets according to one embodiment of the present invention, wherein the X coordinate represents the number of chunk and the Y coordinate represents the repetition frequency. FIG. 7 records the transmission behavior of the access point 12 using the method of the present invention and transmitting one million chunk of packets and the performance thereof. It is observed in FIG. 7 that the overall repetition frequency of chunks is as high as over 60% for the access point using the method of the present invention.

In conclusion, the present invention proposes a compression method featuring dynamic coding for wireless communication in wireless networks, which is characterized in dividing the packet into chunks and determining whether repeated chunks have been encoded before the packet is sent out; replacing the repeated chunks with corresponding codes, and transmitting the encoded chunks and the codes thereof; while transmitting the codes of repeated chunks to a specified client, also transmitting the same information to other clients within the coverage of transmission, whereby other mobile devices also receive the repeated chunks and the codes thereof and store the information; while transmitting the packet containing the repeated chunks, replacing the repeated chunks with the codes thereof.

Therefore, the method of the present invention divides a packet into chunks and determines whether the repeated chunks have been encoded before transmitting the packet. Then, the method of the present invention replaces the repeated chunks with the codes thereof. If the code of the repeated chunk has never been sent out, the code is attached to the repeated chunk. Once the client receives a Huffman code, the Huffman code is used to decode the chunk and restore the encoded packet. While the codes of repeated chunks are transmitted to a specified client, the same information is also transmitted to the clients within the coverage of transmission. Then, the clients store the repeated chunks and the codes thereof. In the present invention, it is unnecessary to transmit the codes to clients separately. While the statistic data of a repeated chunk is insufficient to establish the Huffman code thereof, the access point undertakes the hash operation and generates a hash code, which is to be used in encoding while transmitting the same chunk next time.

The Huffman coding method used by the present invention not only can undertake statistics of the data transmitted before but also can use the statistic information to predict the probability of transmitting the data in the future, whereby can be acquired the most optimized code length. Further, the Huffman coding method greatly reduces the computation load of the clients. Thereby, the clients needn't empty the registers for a long time, and the repetition frequency is higher. The Huffman coding method used by the present invention can use the shortest code to replace the most common repeated chunk.

After dividing a packet into a plurality of chunks in an access point, the method of the present invention establishes information of repetition frequencies for the chunks. Next, the method of the present invention determines whether the Huffman codes and the hash function codes of the chunks have been established. Next, the method of the present invention transmits the chunks and the Huffman codes thereof to all the clients of the wireless network. As the recipients are all the clients of the wireless network, the method of the present invention achieves a high repetition frequency of data. The Huffman coding method used by the present invention neither needs to retransmit the packet nor suffers from packet collision. Further, the Huffman coding method can shorten the length of codes and increase the overall compression rate. The method of the present invention has advantages of simple packet-division tactics and low computation load and is easy to realize in the current network environment.

The present invention has been demonstrated with the embodiments above. However, these embodiments are only to exemplify the present invention but not to limit the scope of the present invention. Any equivalent modification or variation according to the spirit of the present invention is to be also included within the scope of the present invention, which is based on the claims stated below.

What is claimed is:
1. A compression method featuring dynamic coding of signals for wireless communication in wireless networks, the method comprising:
(a): dividing a signal packet into a plurality of chunks in an access point device configured to communicate through the wireless network with at least one client device, actuating said access point device to statistically generate information of repetition frequencies for each of said chunks, and transmitting said chunks to said client device;
(b): for each said chunk having a Huffman code established previously therefor, actuating said access point device to update said previously established Huffman code responsive to the repetition frequency of said chunk exceeding a preset frequency, and thereafter execute process (c)(2);
(b)(1): actuating said access point device to establish a Huffman code for each said chunk not having a Huffman code previously established therefor but having a repetition frequency satisfying said preset frequency, and thereafter execute process (c)(2);
(c): alternatively actuating said access point device to execute process (c)(1) for each said chunk having neither a Huffman code previously established therefor nor a repetition frequency satisfying said preset frequency, and process (c)(2) for others of said chunks;
(c)(1): determining whether a hash function code has been established previously for said chunk; if a hash function code has been previously established for said chunk, transmitting said hash function code to said client device; if a hash function code has not been established for said chunk, encoding said chunk with a hash function code, and transmitting said encoded chunk to said client device;
(c)(2): actuating said access point device to determine whether said Huffman code of each said chunk was transmitted previously to said client device;
if said Huffman code has been transmitted earlier for said chunk, replacing said chunk with said Huffman code corresponding thereto, and transmitting said Huffman code to said client device;
if said Huffman code has not been transmitted earlier for said chunk, assigning said Huffman code to said chunk, and transmitting each said chunk and said Huffman code corresponding thereto to said client device.

2. The compression method featuring dynamic coding of signals for wireless communication in wireless networks according to claim 1 further comprising a process before said process (b), wherein said process before said process (b) includes:
actuating said access point device to determine whether there is a chunk that has not yet been stored;
(1) if there is a chunk that has not yet been stored by said access point device, actuating said access point device to define said chunk that has not been stored as a new chunk, to calculate a hash function code for each said new chunk, to update each said new chunk with said hash function code, and to restore each said new chunk into said signal packet;
(2) if there is no chunk that has not been stored by said access point device, proceeding to process (b).

3. The compression method featuring dynamic coding of signals for wireless communication in wireless networks according to claim 2, further comprising processes (h), (i), (j) and (k) after said process (c)(2), wherein:
(h): receiving and decomposing each signal by said client device transmitted from said access point device;
(i): actuating said client device to determine whether each signal has been generated by either of a Huffman coding method or a hash-function coding method;
(j): if it is determined that said signal has been generated by either said Huffman coding method or said hash-function coding method, actuating said client device to determine whether said Huffman code or said hash function code was transmitted previously by said access point device;

(j)(1) if said Huffman code or said hash function code was transmitted previously by said access point device, actuating said client device to search for said Huffman code or said hash function code for finding the chunk corresponding to said Huffman code or said hash function code and restoring said signal packet, and if said Huffman code or said hash function code was not previously transmitted by said access point device, actuating said client device to request retransmission of said Huffman code or said hash function code and the corresponding chunk;

(k): if it is determined that said signal has neither been generated by said Huffman coding method nor said hash-function coding method, actuating said client device to determine whether said signal is a chunk transmitted with a corresponding Huffman code;

(k)(1) if said signal is the chunk transmitted with the corresponding Huffman code, actuating said client device to store said chunk and said Huffman code attached to said chunk and restore said signal packet using said chunks, and if the signal is not the chunk transmitted with the corresponding Huffman code, actuating said client device to produce the hash function code of said chunk.

4. The compression method featuring dynamic coding of signals for wireless communication in wireless networks according to claim 3, wherein in said process (k), updating of said Huffman code is dependent on a time interval of a cycle with respect to said repetition frequency.

5. The compression method featuring dynamic coding of signals for wireless communication in wireless networks according to claim 4, wherein said Huffman code attached to each said chunk is dependent on said time interval of said cycle with respect to said repetition frequency, and wherein the chunk whose repetition frequency is higher corresponds to a shorter Huffman code, and wherein the chunk whose repetition frequency is lower corresponds to a longer Huffman code.

6. The compression method featuring dynamic coding of signals for wireless communication in wireless networks according to claim 3, wherein each one of said chunks have a predetermined length.

7. The compression method featuring dynamic coding of signals for wireless communication in wireless networks according to claim 3, wherein said Huffman codes and said hash function codes are stored in a memory of said client device.

8. The compression method featuring dynamic coding of signals for wireless communication in wireless networks according to claim 7, wherein said access point device is a wireless network base station.

9. The compression method featuring dynamic coding of signals for wireless communication in wireless networks according to claim 3, wherein said client device is a mobile device.

10. The compression method featuring dynamic coding of signals for wireless communication in wireless networks according to claim 9, wherein said mobile device is either one of a portable gamer, a mobile phone, a smartphone, a tablet computer, or a notebook computer.

\* \* \* \* \*